(12) United States Patent
Funami et al.

(10) Patent No.: US 7,659,796 B2
(45) Date of Patent: Feb. 9, 2010

(54) SURFACE ACOUSTIC WAVE DEVICE AND DUPLEXER AND COMMUNICATION DEVICE USING THE SAME

(75) Inventors: Masayuki Funami, Kyoto (JP); Takeshi Takenoshita, Kyoto (JP); Yuuko Yokota, Kyoto (JP)

(73) Assignee: Kyocera Corporation, Kyoto (JP)

( * ) Notice: Subject to any disclaimer, the term of this patent is extended or adjusted under 35 U.S.C. 154(b) by 117 days.

(21) Appl. No.: 12/078,232

(22) Filed: Mar. 28, 2008

(65) Prior Publication Data
US 2008/0238572 A1    Oct. 2, 2008

(30) Foreign Application Priority Data
Mar. 28, 2007   (JP) .............................. 2007-084509

(51) Int. Cl.
*H03H 9/54*    (2006.01)
*H03H 9/64*    (2006.01)
*H03H 9/70*    (2006.01)

(52) U.S. Cl. ...................................... 333/133; 333/189
(58) Field of Classification Search ................. 333/133, 333/193, 194, 195, 196
See application file for complete search history.

(56) References Cited

U.S. PATENT DOCUMENTS

| | | | |
|---|---|---|---|
| 6,710,677 B2 * | 3/2004 | Beaudin et al. | 333/133 |
| 7,271,684 B2 * | 9/2007 | Nishihara et al. | 333/133 |
| 7,385,464 B2 * | 6/2008 | Shibagaki et al. | 333/133 |
| 7,573,354 B2 * | 8/2009 | Nishihara et al. | 333/133 |

* cited by examiner

*Primary Examiner*—Dean O Takaoka
(74) *Attorney, Agent, or Firm*—Bacon & Thomas, PLLC

(57) ABSTRACT

A surface acoustic wave device includes a first surface acoustic wave filter forming a ladder filter circuit; and a second surface acoustic wave filter having a passband at a frequency range higher than that of the first surface acoustic wave filter. The first surface acoustic wave filter includes a series-arm surface acoustic wave resonator, a parallel-arm surface acoustic wave resonator and an additional surface acoustic wave resonator. The series-arm surface acoustic wave resonator is on a series arm of the ladder filter circuit and includes an IDT electrode. The parallel-arm surface acoustic wave resonator is on a parallel arm of the ladder filter circuit and includes an IDT electrode. The additional surface acoustic wave resonator includes an IDT electrode, is connected in parallel with the series-arm surface acoustic wave resonator, and has a resonance frequency higher than the frequency range of the passband of the second surface acoustic wave filter.

15 Claims, 15 Drawing Sheets

US 7,659,796 B2

SURFACE ACOUSTIC WAVE DEVICE AND DUPLEXER AND COMMUNICATION DEVICE USING THE SAME

CROSS-REFERENCE TO RELATED APPLICATIONS

The present application claims priority under 35 U.S.C. §119 to Japanese Patent Application No. 2007-84509, filed on Mar. 28, 2007, entitled "SURFACE ACOUSTIC WAVE DEVICE, AND DUPLEXER AND COMMUNICATION DEVICE USING THE SAME." The contents of this application are incorporated herein by reference in their entirety.

FIELD OF THE INVENTION

The present invention relates to a surface acoustic wave device, and a duplexer and a communication device using same and particularly to a surface acoustic wave device, and a duplexer and a communication device using same with steeper shoulder characteristics near a passband, which has an attenuation pole at frequencies higher than those of the passband.

BACKGROUND OF THE INVENTION

Recently, with the development of electrode materials and electrode structures having high power durability, surface acoustic wave filters have become necessary for duplexers that serve to separate transmission signals from reception signals in mobile communication devices.

The duplexers need to separate signals of a transmission band sufficiently from signals of a reception band close to the signals of the transmission band. For example, if a transmission band is at frequencies lower than a reception band, the duplexers need to have steep shoulder characteristics at a high frequency region of the transmission band. A circuit structure with a ladder filter with excellent power durability is generally used in a transmission filter passing signals amplified by a power amplifier.

Further, a technique for adding a capacitance in parallel with a resonator of a ladder filter is known to obtain steep shoulder characteristics of the ladder filter.

The recent trend toward modification of the communication standards and global roaming of mobile phones has prompted the requirement to attenuate strictly the frequency bands that are used as another standard near the passbands of duplexers.

SUMMARY OF THE INVENTION

The present invention has been conceived to meet the requirement described above, and provides a surface acoustic wave device, and a duplexer and a communication device using the same with steeper shoulder characteristics of a passband and with an attenuation pole at frequencies higher than the frequencies of the passband.

According to an aspect of the present invention, a surface acoustic wave device includes a first surface acoustic wave filter and a second surface acoustic wave filter. The second surface acoustic wave filter has a passband at frequency range higher than that of the first surface acoustic wave filter. The first surface acoustic wave filter forms a ladder filter circuit, and includes a series-arm surface acoustic wave resonator, a parallel-arm surface acoustic wave resonator and an additional surface acoustic wave resonator. The series-arm surface acoustic wave resonator includes an IDT electrode and is on a series arm of the ladder filter circuit. The parallel-arm surface acoustic wave resonator includes an IDT electrode and is on a parallel arm of the ladder filter circuit. The additional surface acoustic wave resonator includes an IDT electrode, is connected in parallel with the series-arm surface acoustic wave resonator and has a resonance frequency which is higher than the frequency range of the passband of the second surface acoustic wave filter. Further, "a second surface acoustic wave filter whose passband is at frequencies higher than a passband of the first surface acoustic wave filter" is a surface acoustic wave resonator whose resonant frequency is higher than the highest frequency in the passband of the second surface acoustic wave filter.

According to another aspect of the present invention, a duplexer includes the surface acoustic wave device of the above. The duplexer also includes an input terminal of the first surface acoustic wave filter, an output terminal of the second surface acoustic wave filter and a connecting portion.

According to further aspect of the present invention, a communication device includes the above-mentioned duplexer, an antenna, a mixer and a power amplifier. The mixer mixes a transmission signal with a carrier signal and outputs the antenna transmission signal. The power amplifier amplifies the antenna transmission signal and outputs the amplified antenna transmission signal to the antenna via the duplexer.

According to further another aspect of the present invention, a communication device includes a duplexer, an antenna, a amplifier and a mixer. The duplexer includes the surface acoustic wave device of the above. The duplexer includes the above-mentioned surface acoustic wave. The antenna outputs an antenna reception signal to the duplexer. The amplifier amplifies the antenna reception signal received from the duplexer. The mixer separates the reception signal from a carrier signal of the amplified antenna reception signal received from the amplifier.

BRIEF DESCRIPTION OF THE DRAWINGS

The present invention will become apparent from the following detailed description in conjunction with the accompanying drawings, in which.

DETAILED DESCRIPTION OF THE EMBODIMENTS

Figure 1:
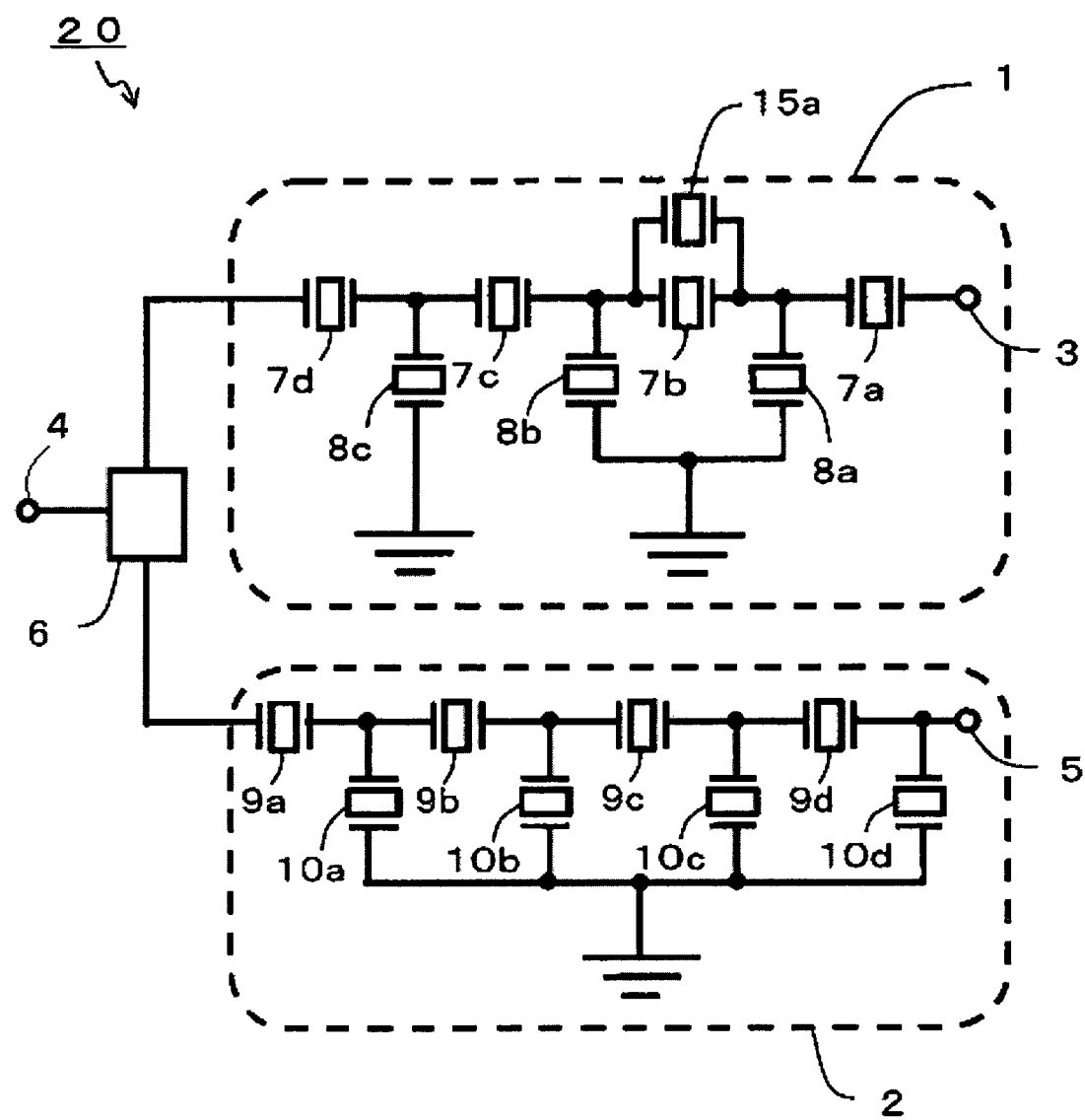
FIG. 1 is a circuit diagram of a surface acoustic wave device according to the first embodiment of the present invention.

Hereinafter, embodiments of the present invention is described below with reference to the accompanying drawings. Herein, the same reference numerals are given to the same parts in the drawings. Further, the size of electrode fingers of each surface acoustic wave resonator, the distance between the electrode fingers or the number of the electrode fingers is chosen for illustration purpose only and is not limited to the size, the distance or the number in the drawings respectively.

In the surface acoustic wave device of the embodiment, the additional surface acoustic wave resonator (hereinafter, referred to as also an "additional surface acoustic wave resonator for adding a capacitance component") with an IDT electrode is connected in parallel to the series-arm surface acoustic wave resonator of the first surface acoustic wave filter constituting the ladder filter circuit. The surface acoustic wave resonator with the IDT electrode functions as a capacitance at frequencies other than the resonance frequency so that the steep shoulder characteristics near a high frequency region of the passband can be obtained. To improve further the shoulder characteristics, a larger capacitance can be connected in parallel to the series-arm surface acoustic wave resonator. However, in this case, the out-of-band attenuation characteristics are deteriorated. This situation is described as follows with reference to FIGS. 12, 13A and 13B.

Figure 12:
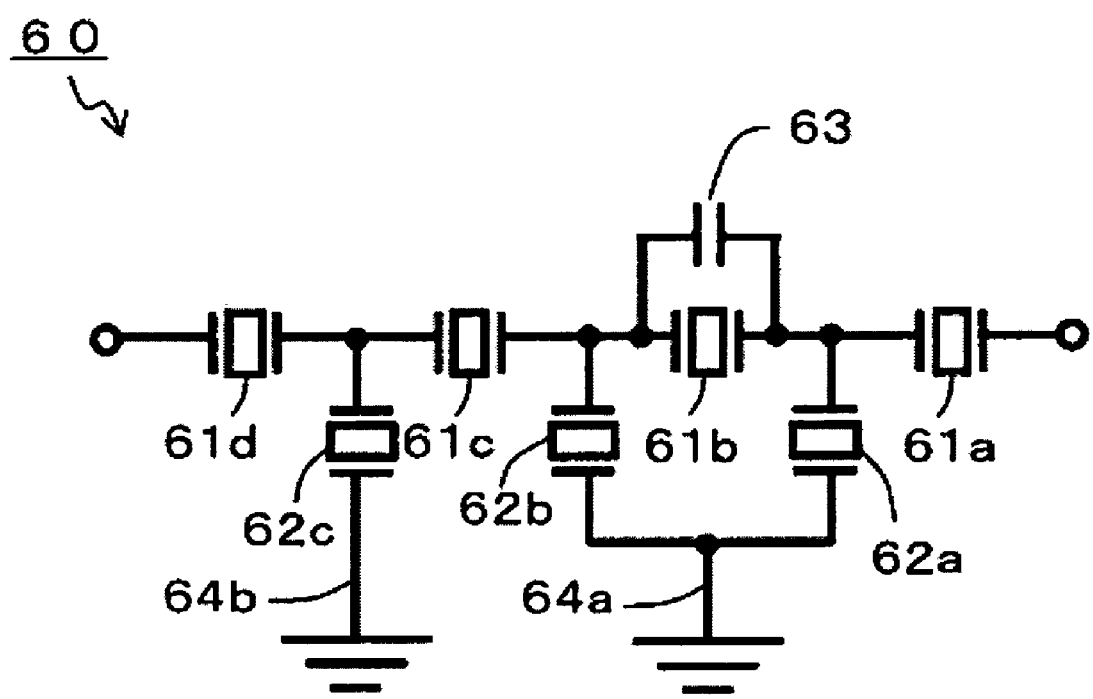
FIG. 12 is a circuit diagram of the conventional surface acoustic wave device.
Figure 13A:
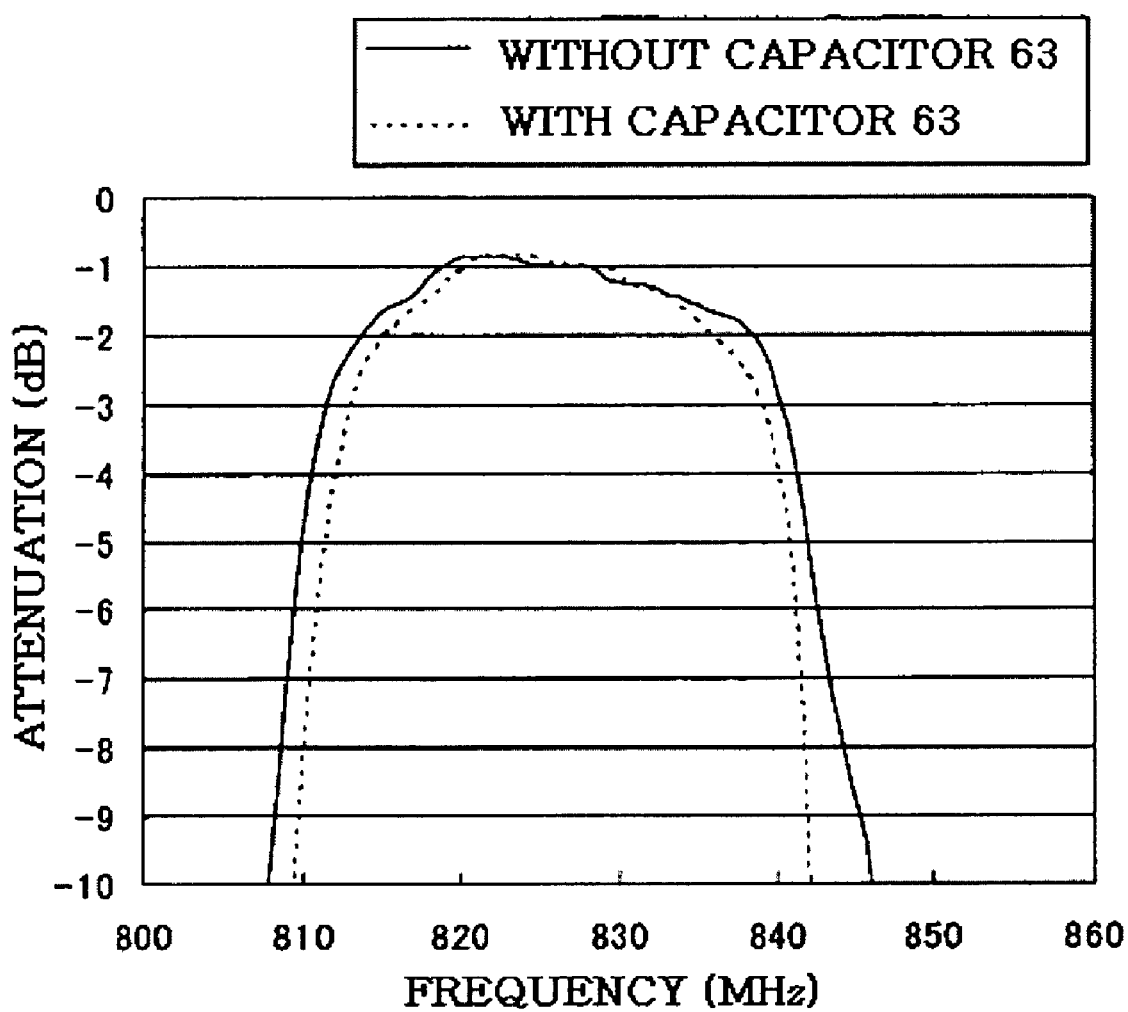
FIGS. 13A and 13B show the pass characteristics of the conventional surface acoustic wave device.
Figure 13B:
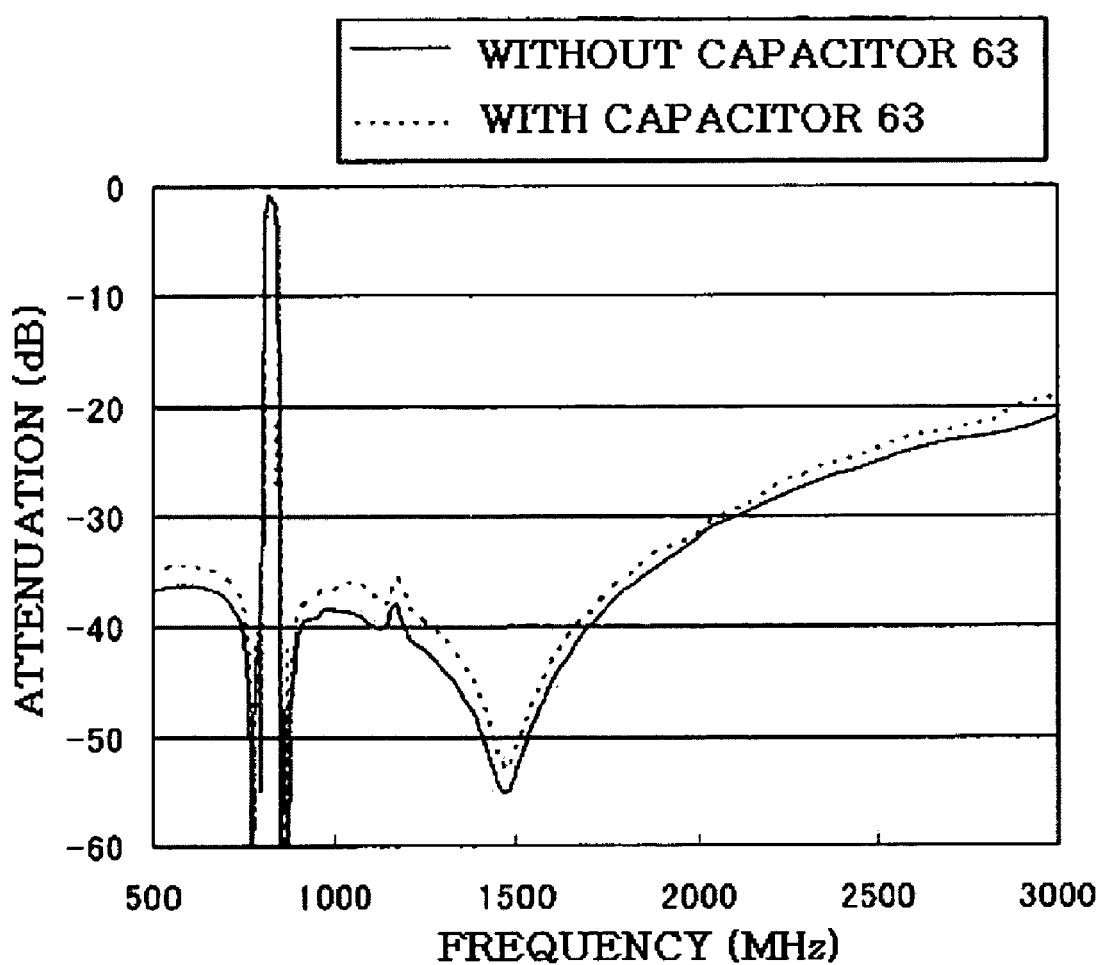

FIG. 12 is a circuit diagram of a known ladder filter 60. FIGS. 13A and 13B are graphs showing the pass characteristics of the ladder filter 60 of FIG. 12; FIG. 13A is a graph showing the pass characteristics of the passband in a specified narrow frequency range and FIG. 13B is a graph showing the pass characteristics over a broad frequency range including high frequencies.

Referring to FIG. 12, the ladder filter 60 is composed of series-arm surface acoustic wave resonators 61a, 61b, 61c and 61d and parallel-arm surface acoustic wave resonators 62a, 62b and 62c. The parallel-arm surface acoustic wave resonators 62a to 62c are connected between signal potentials and the ground potential. Capacitances of the parallel-arm surface acoustic wave resonators 62a to 62c enter into resonance with inductances of the wires connecting them to the ground potential. It is well known that such a resonance results in an attenuation pole located at a frequency higher than the frequencies of the passband. In case of the example shown in FIG. 12, an attenuation pole is located at around 1.5 GHz by the parallel-arm surface acoustic wave resonators 62a and 62b, a wire 64a, the parallel-arm surface acoustic wave resonator 62c and a wire 64b.

Further, a capacitance 63 can be added to the series-arm surface acoustic wave resonator 61b in parallel as shown in FIG. 12 to obtain more steeper characteristics near the passband, which is described with reference to FIG. 13A. In FIG. 13A, the solid line shows the pass characteristics without the capacitance 63, while the dotted line shows the pass characteristics with the capacitance 63 of 2 pF. The addition of the capacitance 63 improves the attenuation amount at 843 MHz by about 14 dB. However, the attenuation amount outside the passband is deteriorated by the addition of the capacitance 63 as shown in FIG. 13B. Therefore, the capacitance connected thereto for the steep shoulder characteristics is limited in order to achieve the desired attenuation amount outside the passband. Accordingly, in the present embodiment, to achieve the attenuation amount in the necessary frequency band as well as the steep shoulder characteristics of the filter with using a larger capacitance, an additional surface acoustic wave resonator with an IDT electrode is used as a capacitance.

If an additional surface acoustic wave resonator is newly connected in parallel with the series-arm surface acoustic wave resonator, it is possible to locate a local attenuation pole at the anti-resonance frequency of the additional surface acoustic wave resonator In the present embodiment, the resonance frequency of the additional surface acoustic wave resonator newly connected to the series-arm surface acoustic wave resonator forming the passband of the first surface acoustic wave filter is higher than the frequencies of the passband of the second surface acoustic wave filter which are higher than those of the passband of the first surface acoustic wave filter. By this, when the first and second surface acoustic wave filters are connected to each other, the resonance characteristics of the additional surface acoustic wave resonator newly connected do not deteriorate the pass characteristics of the second surface acoustic wave filter.

Therefore, according to the present invention, a surface acoustic wave device can have an attenuation pole located around the high frequency side of the passband as well as the steep shoulder characteristics.

To obtain the attenuation pole around the high frequency side of the passband, it is preferable that the electrode-finger pitch of the IDT electrode of the additional surface acoustic wave resonator is smaller than that of the series-arm surface acoustic wave resonator to which the additional surface acoustic wave resonator is connected in parallel.

More preferably, the electrode-finger pitch of the IDT electrode of the surface acoustic wave resonator is set 0.5 to 0.95 times that of the series-arm surface acoustic wave resonator to which the additional surface acoustic wave resonator is connected in parallel. Within this range, a reduction of excitation efficiency of acoustic waves of the additional surface acoustic wave resonator newly connected is suppressed and a deterioration of the anti-resonance resistance is suppressed, and therefore an effective attenuation pole can be obtained. Further, insertion losses in the passband of the first surface acoustic wave filter become smaller.

Further, in case that the second surface wave filter is also of a ladder-type, the electrode-finger pitch of the IDT electrode of the additional surface acoustic wave resonator which is connected in parallel to the series-arm surface acoustic wave resonator of the first surface acoustic wave filter is preferably smaller than the electrode-finger pitch of the series-arm surface acoustic wave resonator of the second surface acoustic wave filter.

More preferably, the electrode-finger pitch of the IDT electrode of the additional surface acoustic wave resonator is set 0.5 to 0.98 times that of the series-arm surface acoustic wave resonator of the second surface acoustic wave filter. Within this range, a reduction of excitation efficiency of acoustic waves of the additional surface acoustic wave resonator newly connected is suppressed and a deterioration of the anti-resonance resistance is suppressed, and therefore an effective attenuation pole can be obtained. Further, a deterioration in the passband of the second surface acoustic wave filter is suppressed.

If the additional surface acoustic wave resonator for adding a capacitance component other than the surface acoustic wave resonators forming the passband is newly added, an area of the surface acoustic wave device is increased. Therefore, the newly connected additional surface acoustic wave resonator should be small as much as possible. Further, in case that, in accordance with the present embodiment, a ration (ratio w/p) of the electrode-finger width to the electro de-finger pitch in the IDT electrode of the additional surface acoustic wave resonator is higher than that of the series-arm surface acoustic wave resonator to which the additional surface acoustic wave resonator is connected in parallel, the desired capacitance can be realized with a smaller number of the pairs of electrode-fingers and a smaller crossing width.

On the contrary, in case that the ratio w/p in the IDT electrode of the additional surface acoustic wave resonator is lower than that of the series-arm surface acoustic wave resonator to which the additional surface acoustic wave resonator is connected in parallel, the resonance resistance and the anti-resonance resistance become large, and therefore the attenuation amount of the newly formed attenuation pole can be increased.

According to the present invention, a duplexer, which uses the surface acoustic wave device of the present invention, can have steeper shoulder characteristics of the filter characteristics and the excellent out-of-band attenuation characteristics around the passband, resulting in the preferable electrical characteristics.

According to the present invention, a communication device can achieve a communication performance in which the currently used communication standard is less interfered with other near communication standards.

First Embodiment

FIG. 1 illustrates a surface acoustic wave device in accordance with the first embodiment of the present invention.

FIG. 1 shows a duplexer 20 includes the first surface acoustic wave filter 1 serving as a transmission filter and the second surface acoustic wave filter 2 serving as a reception filter. A transmission signal from a transmission circuit is inputted to the first surface acoustic wave filter 1 through a terminal 3 and then transmitted to a terminal 4 coupled to an antenna (not shown). A signal received by the antenna is inputted to the surface acoustic wave filter 2 through the terminal 4 and then transmitted to a reception circuit through a terminal 5. In this case, since the output terminal of the transmission filter and the input terminal of the reception filter are the same, the duplexer 20 is provided with a matching circuit 6 so each filter acts like a high impedance of the passband of the other filter. The matching circuit 6 may be included in the duplexer 20 or provided separately.

In FIG. 1, the first surface acoustic wave filter 1 is includes four series-arm surface acoustic wave resonators 7a, 7b, 7c and 7d and three parallel-arm surface acoustic wave resonators 8a, 8b and 8c. These filters 1 and 2 connect each other in a ladder shape to make a circuit. The first surface acoustic wave filter 1 also includes an additional surface acoustic wave resonator 15a that is included in the circuit. The second surface acoustic wave filter 2 is configured with a circuit including four series-arm surface acoustic wave resonators 9a, 9b, 9c and 9d and four parallel-arm surface acoustic wave resonators 10a, 10b, 10c and 10d connected in a ladder shape.

Figure 2:
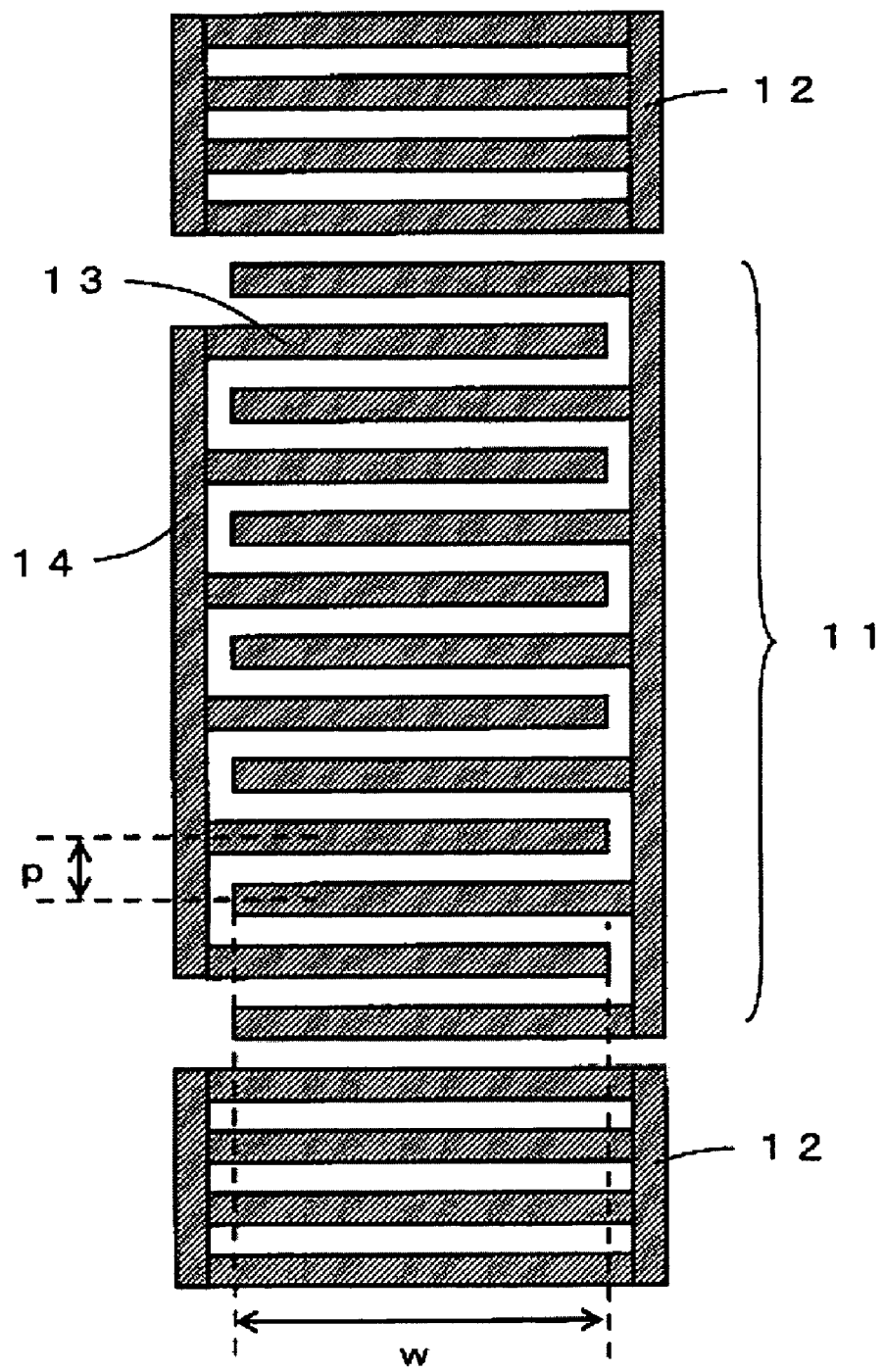
FIG. 2 is a plan view of a surface acoustic wave resonator.

Each surface acoustic wave resonator includes an IDT electrode 11 and reflectors 12 as shown in FIG. 2. The IDT electrode 11 is formed of two comb-like electrodes that face and engage each other, each electrode being composed of electrode fingers 13 and a bus bar (common electrode) 14. In this embodiment, the electrode-finger pitch of the IDT electrode 11 is defined as the distance p from the middle of the electrode-finger in the width direction to the middle of the adjacent electrode finger in the width direction as shown FIG. 2. Further, the crossing width w is defined as the width of the region where the electrode fingers of the comb-like electrodes are overlapping.

Further, an additional surface acoustic wave resonator 15a for adding a capacitance component is connected in parallel with the series-arm surface acoustic wave resonator 7b.

Optimal connection between the series-arm surface acoustic wave resonators 7a to 7d and the additional surface acoustic wave resonator 15a is determined by the frequency design of the series-arm surface acoustic wave resonators 7a to 7d forming the passband. Therefore, connection of the additional surface acoustic wave resonator 15a to the series-arm surface acoustic wave resonators 7a to 7d is not necessarily specified. However, if an additional surface acoustic wave resonator 15a, which is relatively small, is added to the series-arm surface acoustic wave resonator 7a to which the maximum power is applied, it may be affected by heat from the series-arm surface acoustic wave resonator 7a. Thus, it is preferable to add the additional surface acoustic wave resonator 15a to the series-arm surface acoustic wave resonator 7b, 7c or 7d to obtain designed performance because of relatively high power durability.

Figure 3:
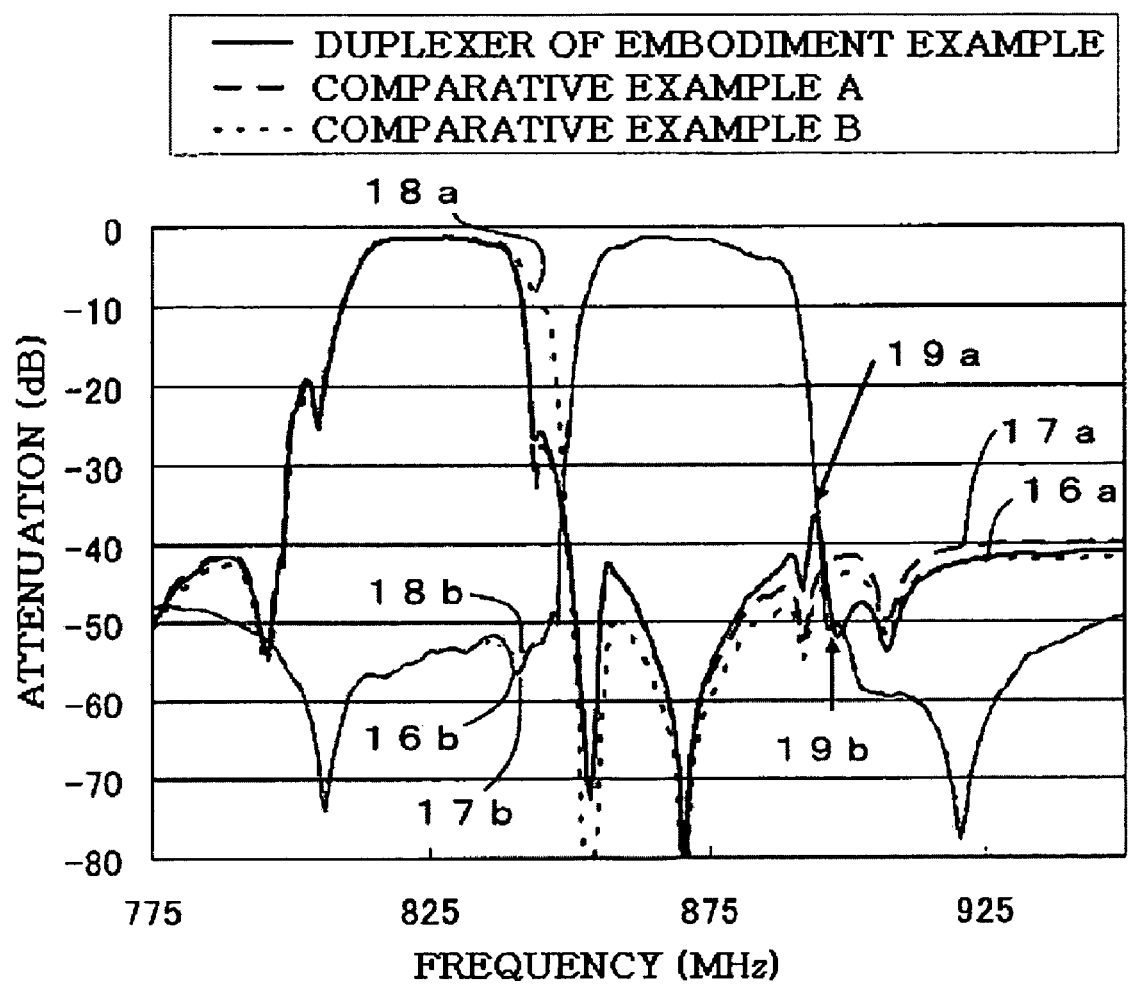
FIG. 3 shows the pass characteristics of the surface acoustic wave device shown in FIG. 1 according to the first embodiment of the present invention.

FIG. 3 shows the pass characteristics of the duplexer 20. In FIG. 3, the horizontal axis represents the frequency and the vertical axis represents the attenuation amount. The characteristic curve 16a indicated by the solid line shows the passband characteristics of the first surface acoustic wave filter 1, whereas the characteristic curve 16b indicated by the solid line shows the pass characteristics of the second surface acoustic wave filter 2.

The characteristic curve 17a indicated by the dashed line shows the pass characteristics of the transmission filter of the duplexer of the comparative example A, whereas the characteristic curve 17b indicated by the dashed line shows the pass-band characteristics of the reception filter of the comparative example A. Here, the duplexer of the comparative example A has the same configuration as that of the present embodiment except that a capacitor (condenser) with the same electrostatic capacitance as that of the additional surface acoustic wave resonator 15a is used instead of the additional surface acoustic wave resonator 15a.

Furthermore, the characteristic curve 18a indicated by the dotted line shows the pass characteristics of the transmission filter of the duplexer of the comparative example B, whereas the characteristic curve 18b indicated by the dotted line shows the pass characteristics of the reception filter of the comparative example B. Here, the duplexer of the comparative example B has the same configuration as that of the present embodiment except that there is no additional surface acoustic wave resonator 15a.

As shown in FIG. 3, the shoulder characteristics of the first surface acoustic wave filter 1 of the present embodiment and of the transmission filter of the comparative example A are much steeper than those of the transmission filter of the comparative example B. On the other hand, at frequencies higher than the frequencies of the passband of the second surface acoustic wave filter 2, the attenuation amount of the comparative example A is worse than that of the comparative example B.

Here, the additional surface acoustic wave resonator 15a of the present embodiment is used as a capacitance. Due to its resonance characteristics, for example, the attenuation amount at frequencies from 898 MHz to 901 MHz can be improved by 7.3 dB compared to the comparative example A. Furthermore, the attenuation amount at 925 MHz can be enhanced by about 1.7 dB.

Further, in FIG. 3, the local maximum point 19a corresponds to the resonance frequency of the additional surface acoustic wave resonator 15a and the local minimum point 19b corresponds to the anti-resonance frequency thereof. An attenuation pole is locally formed by the local minimum point 19b. In general, a frequency difference between a resonance frequency and an anti-resonance frequency is almost determined by a material constant of the piezoelectric substrate used. However, by the capacitance connected in parallel as in the present embodiment, the resonance frequency is not changed but the anti-resonance frequency is lowered. The same effect applies to the additional surface acoustic wave resonator 15a used in the present embodiment. To be specific, the anti-resonance frequency of the series-arm surface acoustic wave resonator 7b is lowered by the capacitance of the additional surface acoustic wave resonator 15a connected in parallel so that the steep shoulder characteristics of the filter can be achieved. However, at the same time, the anti-resonance frequency of the additional surface acoustic wave resonator 15a is lowered by the capacitance of the series-arm surface acoustic wave resonator 7b connected in parallel. Therefore, this should be considered to locate an attenuation pole at a desirable frequency.

Second Embodiment

Figure 4:
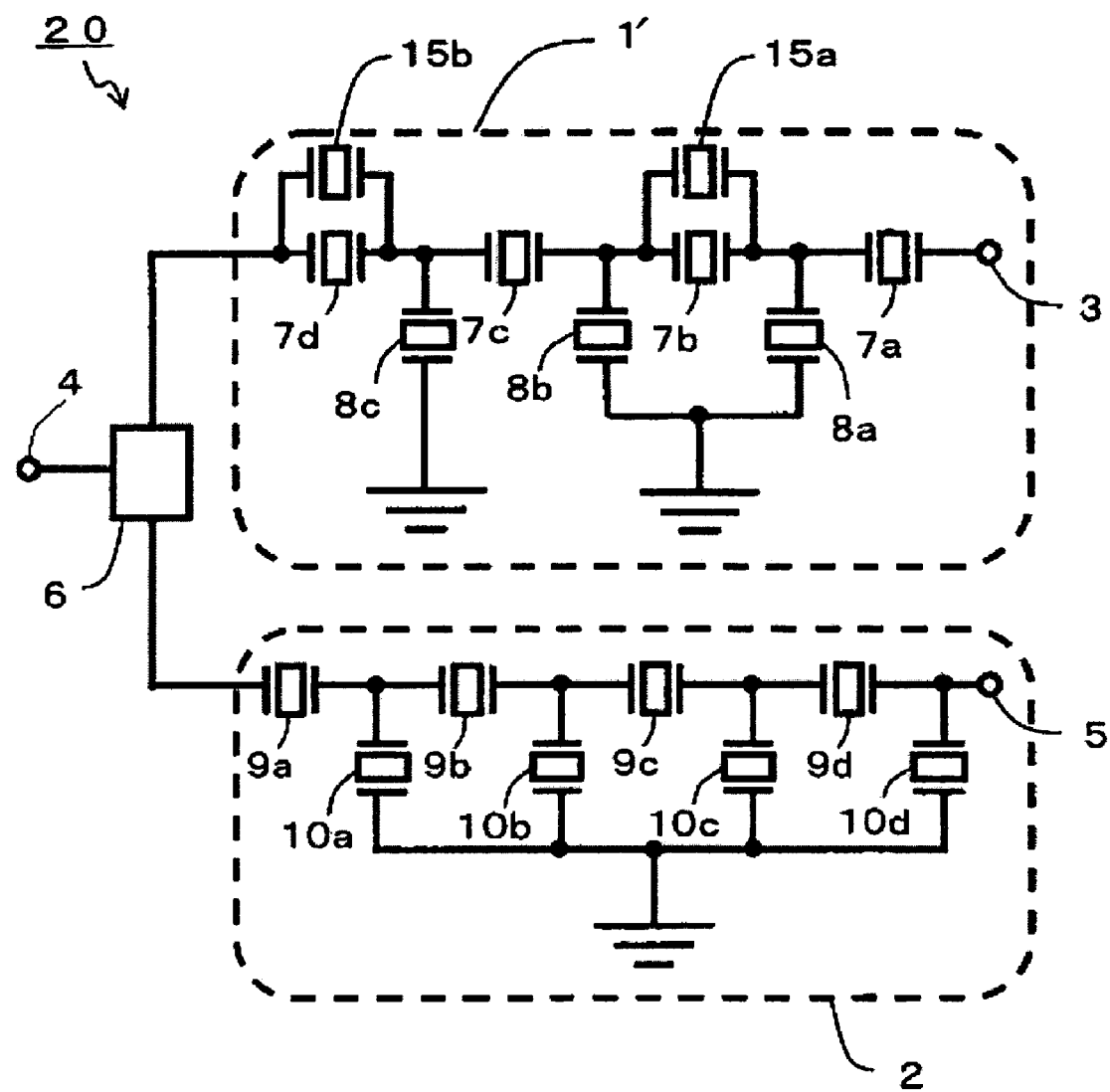
FIG. 4 is a circuit diagram of a surface acoustic wave device accord to the second embodiment of the present invention.

FIG. 4 is a surface acoustic wave device in accordance with the second embodiment of the present invention.

An additional surface acoustic wave resonator 15a with a larger capacitance is preferable to make further the shoulder characteristics near the passband steeper. And in order to avoid a ripple which occurs around the passband, as shown in FIG. 4, additional surface acoustic wave resonators (15a and 15b in the example illustrated in FIG. 4) are preferably connected to several series-arm surface acoustic wave resonators, e.g., 7b and 7d.

Figure 5:
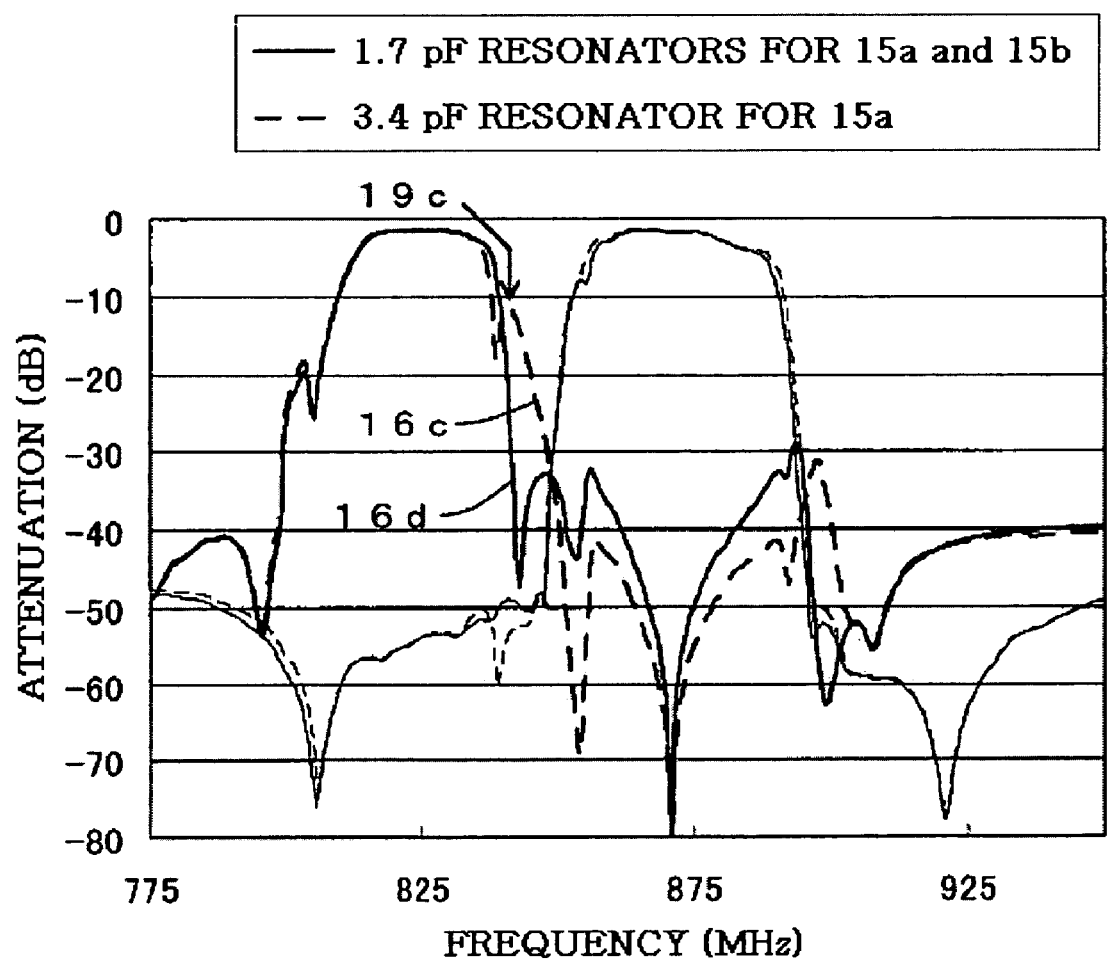
FIG. 5 shows the pass characteristics of the surface acoustic wave device shown in FIG. 4 according to the second embodiment of the present invention.

In FIG. 5, the dashed line indicates the characteristic curve 16c when the additional surface acoustic wave resonator 15a of FIG. 1 has a capacitance of about 3.4 pF. The shoulder characteristics near the passband are steep. In contrast, in FIG. 4, when a surface acoustic wave resonator with the same configuration and a capacitance of about 1.7 pF is used as the additional surface acoustic wave resonators 15a and 15b, there occurs no ripple 19c and the steep shoulder characteristics are steeper.

Further, the capacitance of the additional surface acoustic wave resonator 15a of FIG. 1 for suppressing the ripple near the passband is preferably not higher than about 20% of those of the series-arm surface acoustic wave resonators 7b and 7d of FIG. 4 to which the additional surface acoustic wave resonators 15a and 15b are respectively added.

The resonators shown in the drawings refer to the surface acoustic wave resonators.

Third Embodiment

According to the third embodiment of the present invention, a surface acoustic wave device includes the same elements as that shown in FIG. 4 except that the additional surface acoustic wave resonators 15a and 15b have different electrode-finger pitches while having substantially the same capacitance.

Figure 6:
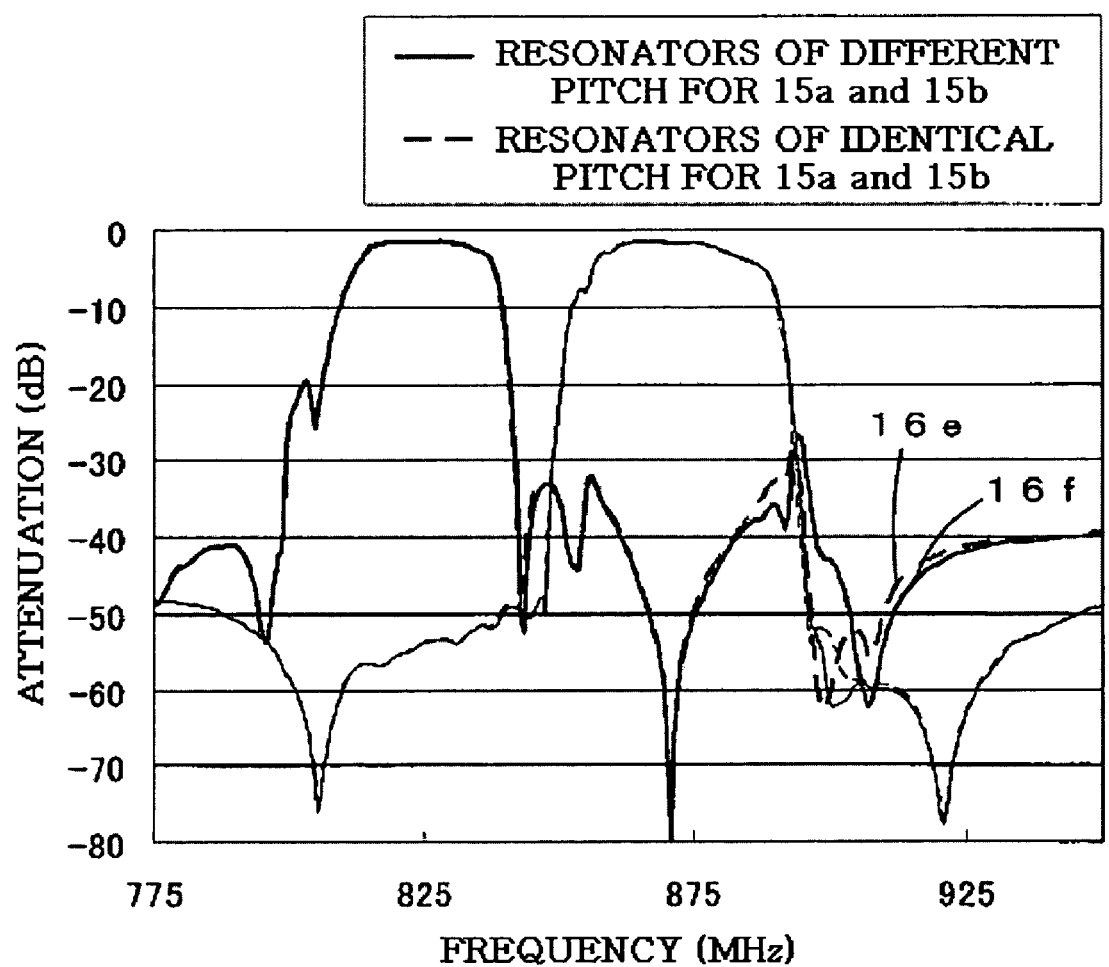
FIG. 6 shows the pass characteristics of a surface acoustic wave device according to the third embodiment of the present invention.

In FIG. 6, the characteristic curve 16e indicated by the dashed line shows the pass characteristics when the additional surface acoustic wave resonators 15a and 15b have the same configuration. The solid line indicates the characteristic curve 16f when the electrode-finger pitch of the IDT electrode of the additional surface acoustic wave resonator 15b is modified so that its resonance frequency is increased by 7 MHz while its capacitance is maintained the same as that of the additional surface acoustic wave resonator 15a. In this manner, higher attenuation amount at higher frequencies can be obtained in comparison with the case of the additional surface acoustic wave resonators 15a and 15b with the exact same configuration.

Fourth Embodiment

The surface acoustic save device of the fourth embodiment has a configuration same as that shown in FIG. 4, except that the resonance frequencies of the additional surface acoustic wave resonators 15a and 15b are higher.

Figure 7:
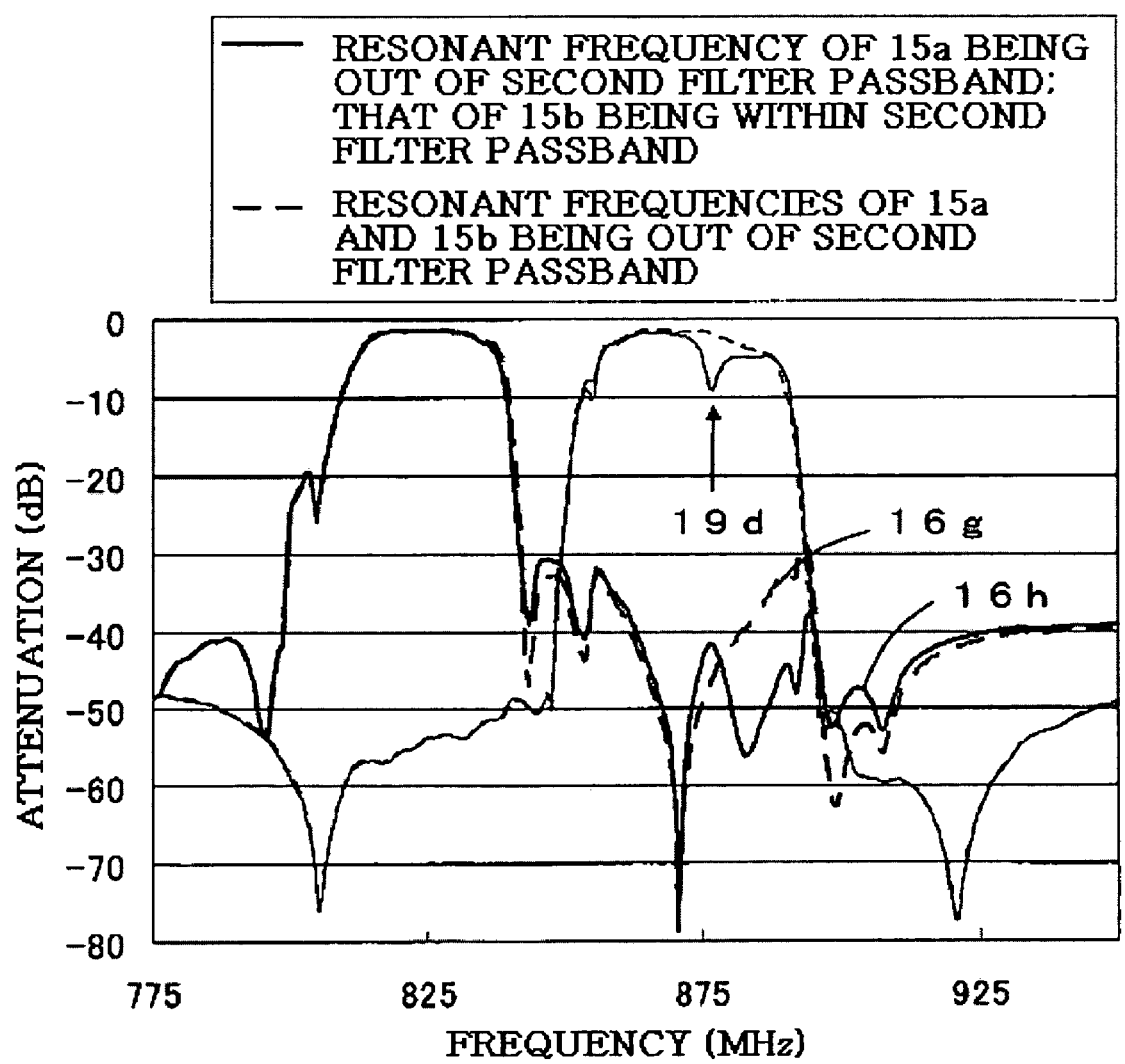
FIG. 7 illustrates the preferable scope of the electrode-finger pitch of an additional surface acoustic wave resonator for adding a capacitance component in the surface acoustic wave device according to the fourth embodiment of the present invention.

In FIG. 7, the characteristics curve 16h indicated by the solid line represents the pass characteristics. Although the entire configuration in the present embodiment is the same as that shown in FIG. 4, the resonance frequency of the additional surface acoustic wave resonator 15b is 7 MHz lower than that of the additional surface acoustic wave resonator 15a while the additional surface acoustic wave resonator 15b has substantially the same capacitance as that of the additional surface acoustic wave resonator 15a. The resonance frequency of the additional surface acoustic wave resonator 15b is located within the passband of the second surface acoustic wave filter 2. In contrast, the characteristics curve 16g indicated by the dashed line shows the pass characteristics when the additional surface acoustic wave resonators 15a and 15b have the same configuration and their resonance frequency is located outside the passband of the second surface acoustic wave filter 2.

As shown in the characteristic curve 16h indicated by the solid line, the additional surface acoustic wave resonator 15b whose resonance frequency is located within the passband of the second surface acoustic wave filter 2 generates a significant ripple 19d within the passband of the second surface acoustic wave filter 2. In order to prevent the deterioration of the pass characteristics of the second surface acoustic wave filter 2, the resonance frequency of the additional surface acoustic wave resonator 15b needs to be higher than frequencies of the passband of the second surface acoustic wave filter 2.

To obtain the resonance frequency of the additional surface acoustic wave resonator 15b higher than frequencies of the passband of the second surface acoustic wave filter 2, the electrode-finger pitch of the IDT electrode of the additional surface acoustic wave resonator 15b is preferably smaller than that of the surface acoustic wave resonator with the highest resonance frequency among the series-arm surface acoustic wave resonators 9b, 9c and 9d of the second surface acoustic wave filter 2. On the other hand, the series-arm surface acoustic wave resonator 9a of the second surface acoustic wave filter 2 is not included herein. This is because, in order to achieve desirable impedance matching with the first surface acoustic wave filter 1, the series-arm surface acoustic wave resonator 9a may be intentionally made to have the resonance frequency rather higher than those of the other series-arm surface acoustic wave resonators and, in this case, the series-arm surface acoustic wave resonator 9a does not contribute to the formation of the passband of the second surface acoustic wave filter 2.

More preferably, the electrode-finger pitch of the IDT electrode of the additional surface acoustic wave resonator 15b is set 0.5 to 0.98 times the electrode-finger pitch of the IDT electrodes of the series-arm surface acoustic wave resonators 9b, 9c and 9d of the second surface acoustic wave filter 2. If less than 0.5 times, excitation efficiency of the IDT electrode becomes poor and therefore the anti-resonance resistance for an effective attenuation pole cannot be obtained. If more than 0.98 times, the passband of the second surface acoustic wave filter 2 is deteriorated.

Fifth Embodiment

The configuration of the surface acoustic wave device of the fifth embodiment is same as that shown in FIG. 1, except that the ratio w/p in the IDT electrode of the additional surface acoustic wave resonator 15a is higher than that of the series-arm surface acoustic wave resonator 7b to which the additional surface acoustic wave resonator 15a is connected in parallel. By doing this, the distance between electrode fingers of the additional surface acoustic wave resonator 15a is reduced, thereby increasing the capacitance. Therefore, the capacitance for the desirable shoulder characteristics can be obtained by the smaller area. Accordingly, the occupation area of the first surface acoustic wave filter 1 is smaller, whereby the surface acoustic wave device can be miniaturized and productivity of the piezoelectric substrate which produces a number of the first surface acoustic wave filters 1 can be improved.

Sixth Embodiment

The configuration of the surface acoustic wave device of the sixth embodiment is same as that shown in FIG. 1, except that the ratio w/p in the IDT electrode of the additional surface acoustic wave resonator 15a is lower than that of the series-arm surface acoustic wave resonator 7b to which the additional surface acoustic wave resonator 15a is connected in parallel. By doing so, the resonance and anti-resonance resistance of the additional surface acoustic wave resonator 15a increases. Accordingly, the attenuation amount of the local maximum point (resonance point) and the local minimum point (anti-resonance point) can be further increased.

Seventh Embodiment

As described above, the duplexers of the embodiments have the steep shoulder characteristics of the filter characteristics and the excellent out-of-band attenuation characteristics near the passband. Further, the duplexers of the embodiments can be applied to communication devices.

The communication device of the present embodiment, which includes a duplexer having the surface acoustic wave device of the present embodiment, is provided with a mixer for generating an antenna transmission signal by mixing a transmission signal with a carrier signal, a band-pass filter with a surface acoustic wave device for attenuating unwanted signals from the antenna transmission signal and a power amplifier for amplifying the amplified antenna transmission signal and transmitting the amplified antenna transmission signal to the antenna via a duplexer. Furthermore, the communication device of the present embodiment, which includes a duplexer having the surface acoustic wave device of the present embodiment, is also provided with the antenna, a low-noise amplifier for amplifying the antenna reception signal received by the antenna through the duplexer, a band-pass filter with a surface acoustic wave device for attenuating unwanted signals from the antenna reception signal amplified by the low-noise amplifier and a mixer for separating a reception signal from the carrier signal of the antenna reception signal transmitted from the band-pass filter.

Figure 8:
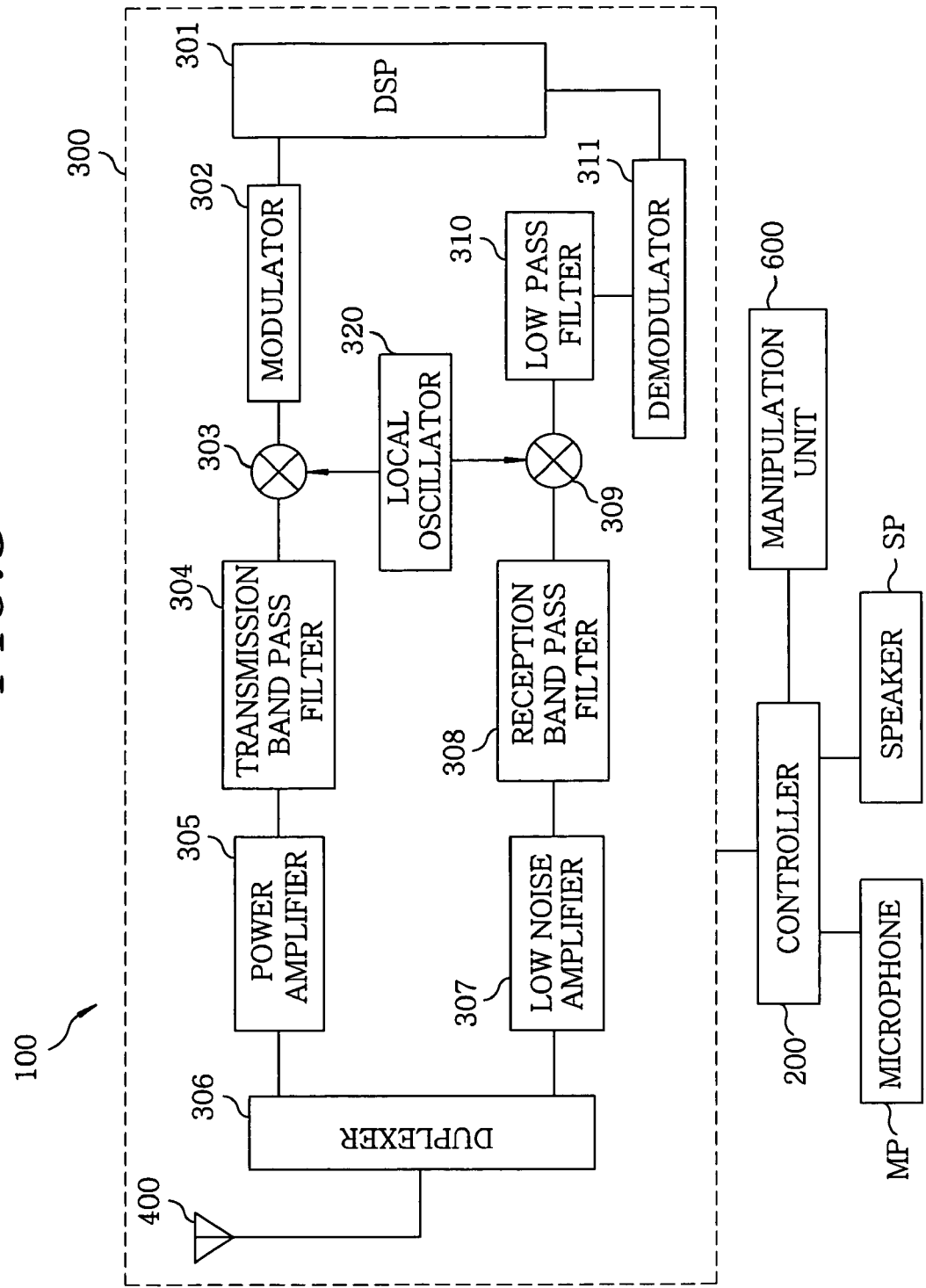
FIG. 8 is a block diagram of a communication device using the surface acoustic wave device according to the present embodiment.

FIG. 8 is a block diagram schematically showing a configuration of an exemplary communication device 100. The communication device 100 mainly includes a transmission/reception unit 300, an antenna 400, a controller 200, an operating unit 600, a microphone MP and a speaker SP.

The controller 200 collectively controls various operations of the communication device 100. The controller 200 is provided with a CPU, a RAM, a ROM and the like, and it reads and executes programs stored in the ROM so that various controls and functions of the communication device 100 can be made.

An analog voice signal inputted into the transmission/reception unit 300 from the microphone MP through the controller 200 is converted from an analog signal to a digital signal by a DSP (Digital Signal Processor) 301, modulated by a modulator 302 and then frequency-converted by a mixer 303 using an oscillation signal created by a local oscillator 320. The output of the mixer 303 sequentially passes through a transmission band-pass filter 304, a power amplifier 305 and a duplexer 306 and it is then outputted from the antenna 400 as a transmission signal.

On the other hand, a received signal is fed to a mixer 309 from the antenna 400 through the duplexer 306, a low-noise amplifier 307 and a reception band-pass filter 308. After the mixer 309 frequency-converts the received signal using the oscillation signal created by the local oscillator 320, the converted signal passes through a low-pass filter 310 and is then demodulated by a demodulator 311. Further, the demodulated signal is converted from a digital signal into an analog signal by the DSP 301 and the converted signal, i.e. the analog voice signal, is outputted from the speaker SP after passing through the controller 200.

The operating unit 600 receives various inputs for the communication device 100 from users and is composed of, e.g., a variety of buttons.

The duplexers of the embodiments are used as the duplexer 306 of the communication device 100.

Although ladder filters have been exemplified for the second surface acoustic wave filter 2 in the above described embodiments, it should be noted that the second surface acoustic wave filter 2 is not necessarily of a ladder-type and DMS-type or lattice-type filters can be used.

Figure 14:
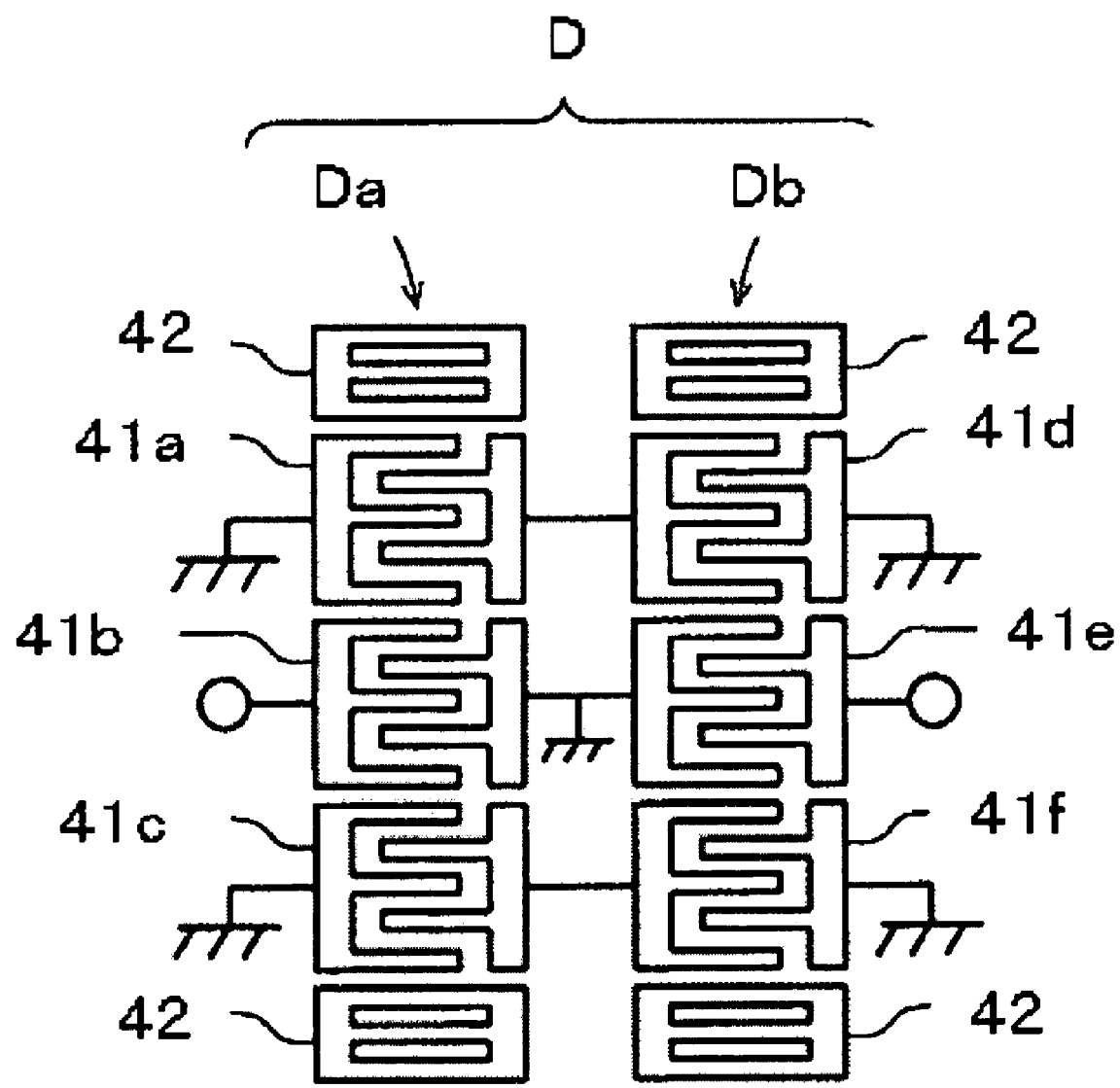
FIG. 14 is a plan view of a DMS filter used for the reception filter in the surface acoustic wave device according to the embodiment.

FIG. 14 is a plan view for schematically showing a typical structure of a DMS (Double Mode Saw) filter D included in a duplexer. The DMS filter D, which is a multi-mode filter, includes a filter Da and another filter Db connected to each other in a two-stage structure. The filter Da includes three IDTs 41a, 41b and 41c adjacent to each other; and two reflectors 42 respectively arranged at both ends of an IDT electrode group having the three IDTs 41a, 41b and 41c. However, the structure of the DMS filter D is not limited to the two-stage structure. Each of the IDTs 41a, 41b and 41c includes a pair of comb-shaped electrodes arranged to face each other such that the lengthwise direction thereof is perpendicular to the propagation direction of the surface acoustic wave in the piezoelectric substrate. Each of the reflectors 42 also includes lattice-shaped electrodes arranged such that the lengthwise direction thereof is perpendicular to the propagation direction of the surface acoustic wave in the piezoelectric substrate.

Likewise, the filter Db includes three IDTs 41*d*, 41*e* and 41*f* adjacent to each other; and two reflectors 42 respectively arranged at both ends of an IDT array having the three IDTs 41*a*, 41*b* and 41*c*. Each of the IDTs 41*d*, 41*e* and 41*f* includes a pair of comb-shaped electrodes arranged to face each other such that the lengthwise direction thereof is perpendicular to the propagation direction of the surface acoustic wave in the piezoelectric substrate. Each of the reflectors 42 also includes lattice-shaped electrodes arranged such that the lengthwise direction thereof is perpendicular to the propagation direction of the surface acoustic wave in the piezoelectric substrate.

However, the configuration of the DMS filter D is not limited to the above one in which the filter of each stage in the DMS filter D includes three IDTs, but any configuration may be adopted so long as it includes two or more IDTs. In case of using the multi-mode filter as the second surface acoustic wave filter 2 as above, there is an advantage in that steeper characteristics can be achieved in frequencies lower than the reception passband when the reception signal is received. Further, the number of electrode pairs, the crossing width, the number of reflectors and the like can be properly chosen according to the design.

EXAMPLES

Hereinafter, examples of the duplexer using the surface acoustic wave filter of the present invention are described.

First, a piezoelectric substrate was formed of lithium tantalite (LiTaO$_3$), and a Ti thin-film with a thickness of 6 nm was formed on a main surface of the substrate. Then, an Al—Cu thin-film with a thickness of 125 nm was formed thereon. The Ti and Al—Cu thin-films were laminated three times alternately, thereby forming a Ti/Al—Cu laminated film having six thin-layers in total. The Al—Cu thin-film refers to an alloy thin-film where a very small amount of Cu was added to Al.

Figure 9:
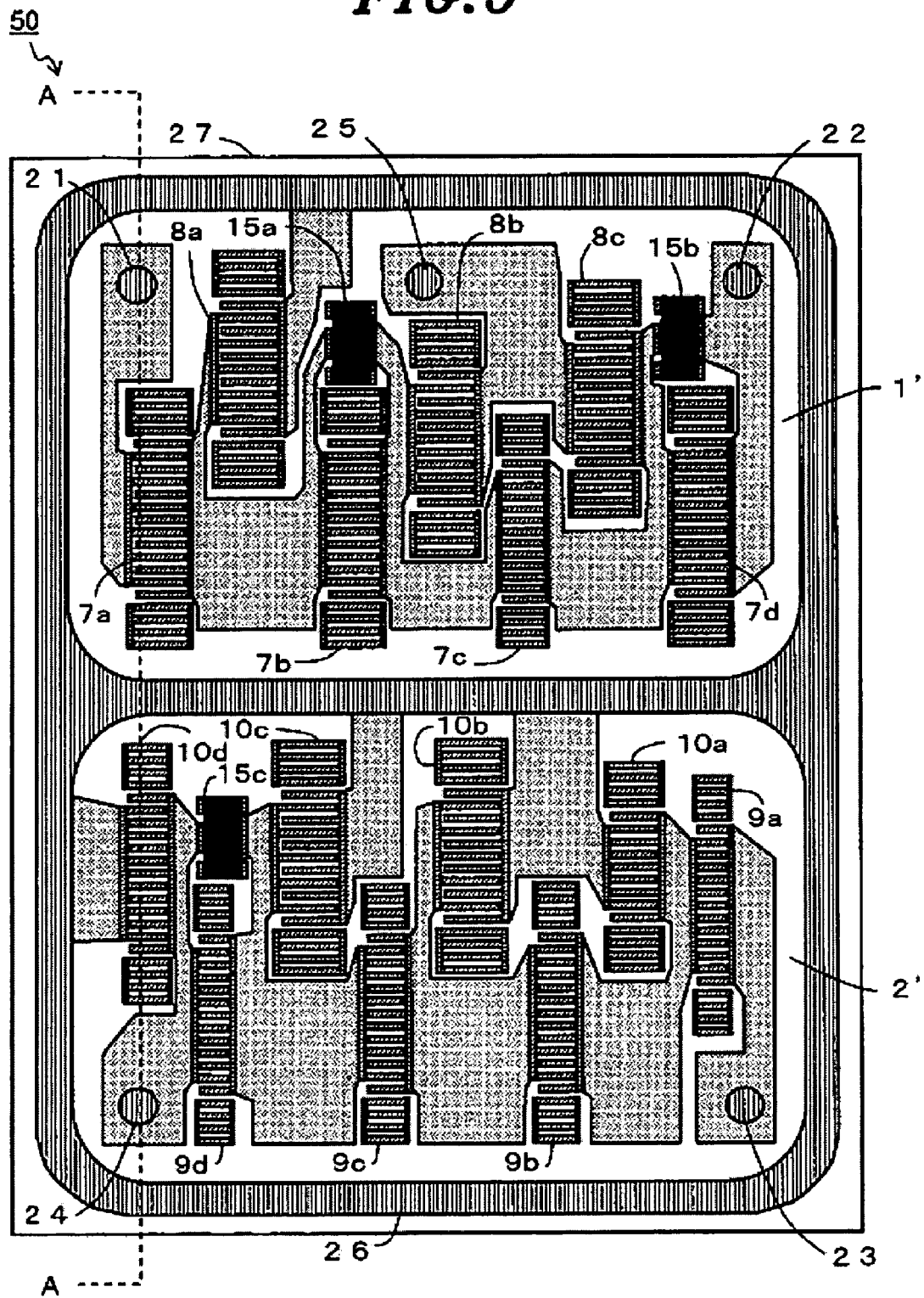
FIG. 9 is a plan view of a piezoelectric substrate of the surface acoustic wave device according to the present embodiment.

Next, a photoresist with a thickness of about 0.5 µm was coated on the main surface of the phizoelectric substrate by using a resist coater. Thereafter, photoresist patterns were exposed by a reduction projection aligner (stepper) so that surface acoustic wave resonators, wiring and electrodes were arranged as shown in FIG. 9. After that, an undesired photoresist was dissolved by a development apparatus with using an alkaline developing solution.

Then, an electrode pattern shown in FIG. 9 was formed by an RIE (Reactive Ion Etching) apparatus. In FIG. 9, the reference numeral 1' indicates a transmission filter unit and the reference numeral 2' indicates a reception filter unit. The circuit configuration of the surface acoustic wave resonator determining the passband was the same as that of FIG. 1 and additional surface acoustic wave resonators 15*a*, 15*b* and 15*c* serving as capacitance elements were respectively connected in parallel with series-arm surface acoustic wave resonators 7*b*, 7*d* and 9*d*.

A protective film (not shown) was then formed on a predetermined area of the circuit pattern. That is, a SiO$_2$ film with a thickness of about 15 nm was formed on the main surface of the electrode pattern and piezoelectric substrate by using a CVD (Chemical Vapor Deposition) apparatus. After then, the photoresist was patterned by photolithography and the SiO$_2$ film of electrodes of the flip-chip, e.g., input/output electrodes, ground electrodes and pad electrodes, was etched by the RIE apparatus or the like.

Next, a laminated electrode where Cr, Ni and Au layers were formed in that order was formed on the region where the SiO$_2$ film had been removed by using a sputtering apparatus. Here, the electrode had 0.01 µm of Cr, 1 µm of Ni and 0.2 µm of Au.

The photoresist and the undesired laminated electrode portion were simultaneously removed by a lift-off method, and the part where the laminated electrode had been formed, i.e. an input electrode 21 of the transmission filter, an output electrode 22 of the transmission filter, an input electrode 23 of the reception filter, an output electrode 24 of the reception filter, a ground electrode 25 of the transmission filter and a ring-shape electrode 26, became the electrode unit of the flip-chip to connect a bump of the flip-chip. Further, the ring-shape electrode 26 was to airtightly seal the filter units as will be described later, and it can be formed if necessary. Here, the ring-shape electrode 26 also serves as a ground electrode of the reception filter unit 2'.

Next, the piezoelectric substrate was diced along the dicing line and then separated into filter chips 50.

Subsequently, a conductive member 32 was printed on a conductor which was made of silver and formed on a ceramic circuit board 28 of a laminated structure corresponding to the input electrode 21 of the transmission filter, the output electrode 22 of the transmission filter, the input electrode 23 of the reception filter, the output electrode 24 of the reception filter, the ground electrode 25 of the transmission filter and the ring-shape electrode 26. A solder was used as the conductive member 32. Further, the circuit board 28 was a board for a multiple molding.

Then, each chip 50 was provisionally joined to the ceramic circuit board 28 by a flip-chip mounting device such that a surface where the electrodes were formed faced down, which was performed in N$_2$ atmosphere. In addition, bake was performed in N$_2$ atmosphere to melt the solder of the conductive member 32, thereby joining the chips 50 and the circuit board 28 together. Further, an inductor formed of a line (not shown) which connected the signal potential to the ground potential inside the circuit board 28 realized the matching circuit 6.

Next, by applying a resin to the circuit board 28 to which the chip 50 had been attached and baking it in N$_2$ atmosphere, the chip 50 was resin-sealed.

Figure 10:
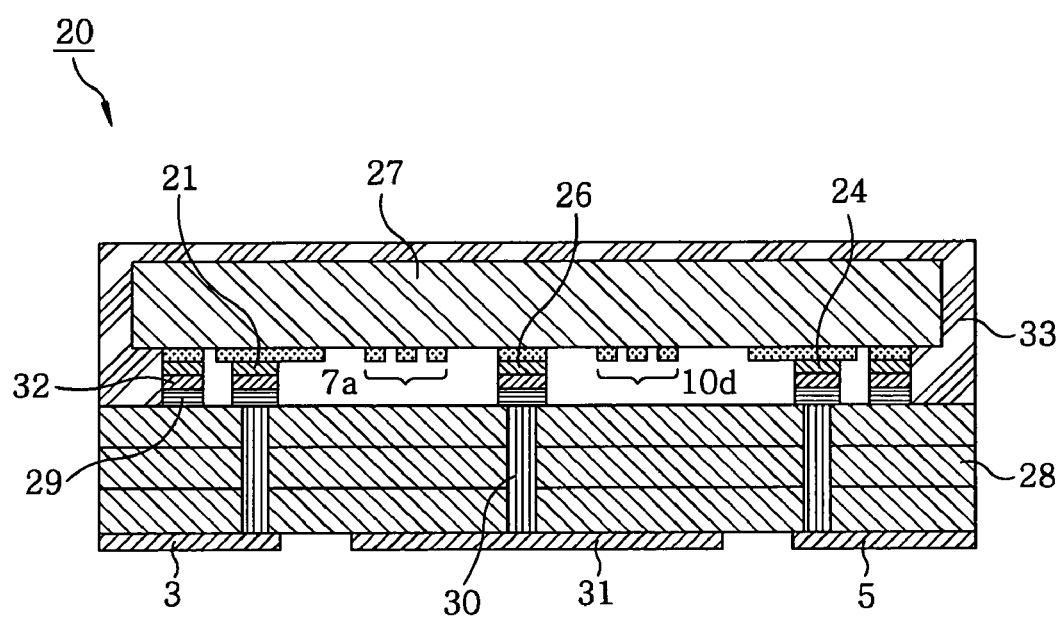
FIG. 10 is a cross-sectional view of an exemplary surface acoustic wave device of the present embodiment.

After then, the circuit board 28 was diced along a dicing line and divided into pieces so that the duplexer 20 (duplexer A) of the embodiment was manufactured. FIG. 10 shows a cross-sectional view of the duplexer 20. In specific, FIG. 9 shows a plan view of the piezoelectric substrate 27 facing the ceramic circuit board 28 in FIG. 10 and FIG. 10 is a cross sectional view of the piezoelectric substrate 27 taken along a line A-A of FIG. 9. Further, each piece of the circuit board 28 has an area of 2.5×2.0 mm square and a thickness of 0.375 mm.

As the comparative example 1, a duplexer B with the same configuration as that of the duplexer A of the above example, except that there were no additional surface acoustic wave resonators 15*a*, 15*b* and 15*c* was fabricated.

Figure 11:
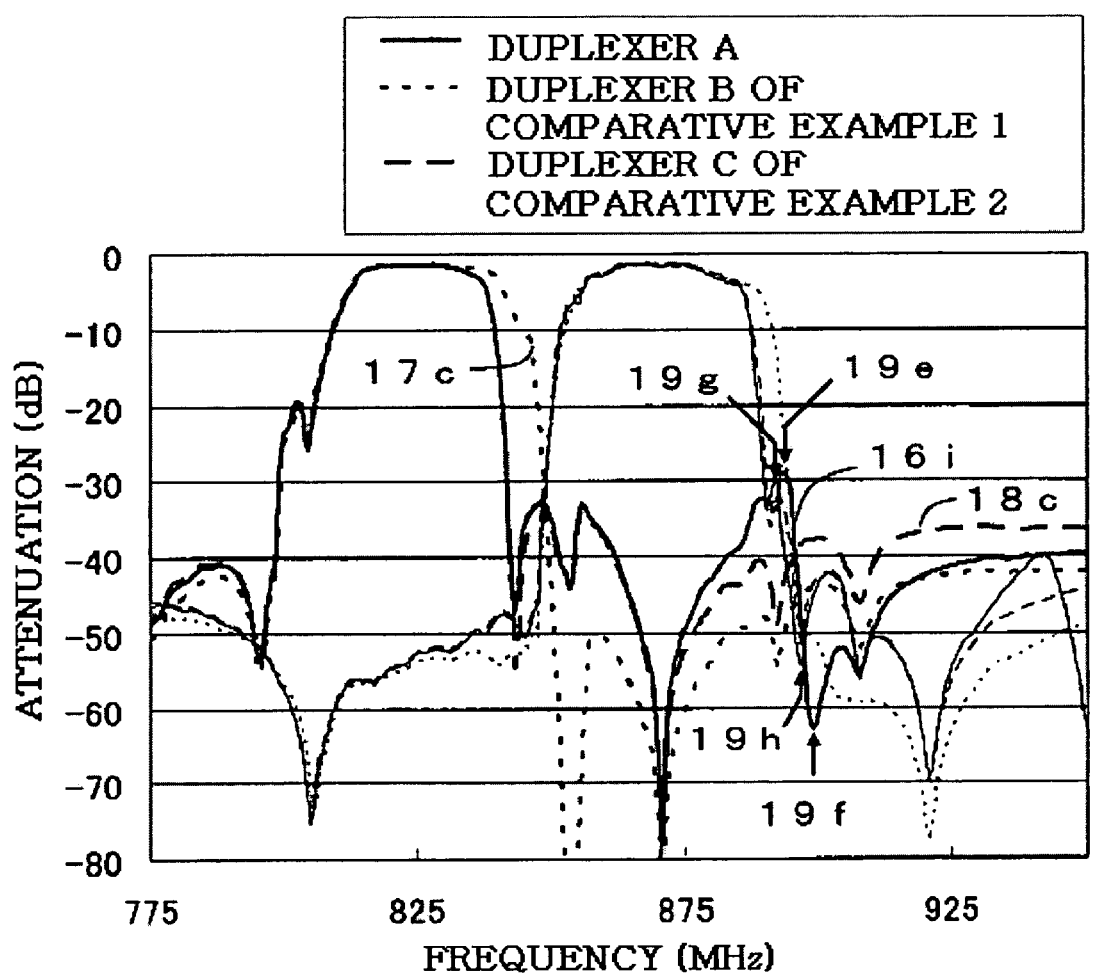
FIG. 11 is shows the pass characteristics of the exemplary surface acoustic wave device of the present embodiment.

FIG. 11 is a graph showing the pass-band characteristics of the duplexers A and B. The horizontal axis represents the frequency (unit: MHz) and the vertical axis represents the attenuation amount (unit: dB). The characteristic curve 16*i* indicated by the solid line shows the pass-band characteristics of the duplexer A of the present example, while the characteristic curve 18*c* indicated by the dashed line shows the pass-band characteristics of the duplexer B of the comparative example 1.

On the other hand, the characteristic curve 17*c* indicated by the dotted line showing the pass-band characteristics of the duplexer C as the comparative example 2 where the additional surface acoustic wave resonators 15a, 15b and 15c are replaced by capacitors with the same capacitance was derived from simulation.

In the characteristic curve 16i of the duplexer A, the local maximum point 19e and the local minimum point 19f respectively coincide with the resonance frequency and anti-resonance frequency of the additional surface acoustic wave resonators 15a and 15b. In this example, the electrode-finger pitch of each IDT electrode of the additional surface acoustic wave resonators 15a and 15b was adjusted so that the resonance and anti-resonance frequencies of the additional surface acoustic wave resonators 15a and 15b could substantially coincide with each other.

As to the series-arm surface acoustic wave resonator 7b to which the additional surface acoustic wave resonator 15a was coupled, the electrode-finger pitch thereof was about 2.39 µm, the number of the pairs of electrode fingers was 100 and the electrode-finger crossing width was about 76 µm.

As to the series-arm surface acoustic wave resonator 7d to which the additional surface acoustic wave resonator 15b was coupled, the electrode-finger pitch thereof was about 2.39 µm, the number of the pairs of electrode fingers was 80 and the electrode-finger crossing width was about 86 µm.

The additional surface acoustic wave resonators 15a and 15b had an electrode-finger pitch of about 2.14 µm, the number of the pairs of electrode fingers was 20 and an electrode-finger crossing width of about 86 µm.

Further, the resonance frequency and anti-resonance frequency of the surface acoustic wave resonator 15c correspond to the local maximum point 19g and the local minimum point 19h, respectively.

As to the series-arm surface acoustic wave resonator 9d to which the surface acoustic wave resonator 15c was coupled, the electrode-finger pitch thereof was about 2.23 µm, the number of the pairs of electrode fingers was 80 and the electrode-finger crossing width was about 22 µm.

The surface acoustic wave resonator 15c had an electrode-finger pitch of about 2.02 µm, the number of the pairs of electrode fingers was 10 and an electrode-finger crossing width of about 80 µm.

The ratio w/p in the IDT electrode of the surface acoustic wave resonator determining the passband was about 0.43, while the ratio w/p in the IDT electrode of the additional surface acoustic wave resonators 15a, 15b and 15c serving as capacitance components was about 0.63.

As a result, the additional surface acoustic wave resonators 15a and 15b had a capacitance of 1.7 pF and the surface acoustic wave resonator 15c had a capacitance of 0.5 pF.

As shown in FIG. 11, the shoulder characteristics near the passbands of the transmission and reception filters 1 and 2 of the duplexer A of the present example were much steeper than those of the comparative example 1.

Further, the attenuation amount of the duplexer A at frequencies from 898 MHz to 901 MHz was improved by about 19.9 dB compared to the duplexer C of the comparative example 2. The attenuation amount at 925 MHz was also improved by approximately 4.9 dB.

Furthermore, the attenuation amount of the duplexer A at frequencies from 843 MHz to 846 MHz was improved by about 24.9 dB compared to the duplexer B of the comparative example 1.

The present invention is not limited to the embodiments and examples described above and various modification may be made without departing from the scope of the invention. For example, at least one of the additional surface acoustic wave resonators 15a, 15b and 15c serving as capacitance components may be used and more surface acoustic wave resonators may also be used.

The additional surface acoustic wave resonators 15a, 15b and 15c serving as capacitance components may have different electrode-finger pitches or the ratio w/p values. If so, attenuation poles may be located at different many locations. In particular, in the same filter, by placing the anti-resonance frequencies of the additional surface acoustic wave resonators 15a, 15b and 15c serving as capacitance components close to each other, the attenuation amount may be increased in the wide band. If the anti-resonance frequencies are the same, the attenuation amount may be further increased.

Further, partial omission or apodization may be performed on the structure of the additional surface acoustic wave resonators 15a, 15b and 15c serving as capacitance components and the capacitances or anti-resonance frequencies thereof may be adjusted. This is the same to the surface acoustic wave resonators forming the passband.

Although the embodiments have been described with respect to the duplexer where two different filters were used to perform transmission and reception, the present invention may also be applied to surface acoustic wave devices with transmission filters according to different standards.

While the invention has been shown and described with respect to the embodiments, it will be understood by those skilled in the art that various changes and modification may be made without departing from the scope of the invention as defined in the following claims.

What is claimed is:

1. A surface acoustic wave device comprising:
   a first surface acoustic wave filter forming a ladder filter circuit; and
   a second surface acoustic wave filter having a passband at a frequency range higher than that of the first surface acoustic wave filter,
   the first surface acoustic wave filter comprising:
   at least one series-arm surface acoustic wave resonator on a series arm of the ladder filter circuit including an IDT electrode;
   at least one parallel-arm surface acoustic wave resonator on a parallel arm of the ladder filter circuit including an IDT electrode; and
   an additional surface acoustic wave resonator including an IDT electrode, connected in parallel with the series-arm surface acoustic wave resonator and having a resonance frequency higher than the frequency range of the passband of the second surface acoustic wave filter.

2. The surface acoustic wave device of claim 1, wherein an electrode-finger pitch of the IDT electrode of the additional surface acoustic wave resonator is smaller than that of the series-arm surface acoustic wave resonator to which the additional surface acoustic wave resonator is connected in parallel.

3. The surface acoustic wave device of claim 2, wherein the electrode-finger pitch of the IDT electrode of the additional surface acoustic wave resonator is set 0.5 to 0.95 times that of the series-arm surface acoustic wave resonator to which the additional surface acoustic wave resonator is connected in parallel.

4. The surface acoustic wave device of claim 1, wherein the second surface acoustic wave filter forms a ladder filter circuit and comprises:
   a series-arm surface acoustic wave resonator including an IDT electrode and being on a series arm of the ladder filter circuit; and a parallel-arm surface acoustic wave resonator on a parallel arm of the ladder filter circuit including an IDT electrode, wherein the electrode-finger pitch of the IDT electrode of the additional surface acoustic wave resonator is smaller than that of the series-arm surface acoustic wave resonator of the second surface acoustic wave filter.

5. The surface acoustic wave device of claim 4, wherein the electrode-finger pitch of the IDT electrode of the additional surface acoustic wave resonator is set 0.5 to 0.98 times that of the series-arm surface acoustic wave resonator of the second surface acoustic wave filter.

6. The surface acoustic wave device of claim 1, wherein the ratio of the electrode-finger width to the electrode-finger pitch in the IDT electrode of the additional surface acoustic wave resonator is higher than that of the series-arm surface acoustic wave resonator to which the additional surface acoustic wave resonator is connected in parallel.

7. The surface acoustic wave device of claim 1, wherein the ratio of the electrode-finger width to the electrode-finger pitch in the IDT electrode of the additional surface acoustic wave resonator is lower than that of the series-arm surface acoustic wave resonator to which the surface acoustic wave resonator is connected in parallel.

8. The surface acoustic wave device of claim 1, wherein the first surface acoustic wave filter includes a plurality of series-arm surface acoustic wave resonators, and wherein the additional surface acoustic wave resonator is connected in parallel with at least one series-arm surface acoustic wave resonator other than the closest series-arm surface acoustic wave resonator to an input terminal of the first surface acoustic wave filter.

9. The surface acoustic wave device of claim 1, wherein the first surface acoustic wave filter includes a plurality of series-arm surface acoustic wave resonators and further including a plurality of additional surface acoustic wave resonators each being connected in parallel with each of at least two of the series-arm surface acoustic wave resonators.

10. The surface acoustic wave device of claim 9, wherein the additional surface acoustic wave resonator has a capacitance not more than 20% of that of the series-arm surface acoustic wave resonator to which the additional surface acoustic wave resonator is connected in parallel.

11. The surface acoustic wave device of claim 9, wherein the first surface acoustic wave filter includes at least two of the additional surface acoustic wave resonators which have the same capacitance and different electrode-finger pitches each other.

12. The surface acoustic wave device of claim 1, wherein the second surface acoustic wave filter forms a DMS filter circuit.

13. A duplexer comprising:
the surface acoustic wave device of claim 1;
an input terminal of the first surface acoustic wave filter as a transmission side filter;
an output terminal of the second surface acoustic wave filter as a reception side filter;
a connecting portion which connects an antenna and an end portion of the first surface acoustic wave filter and a first portion of the second surface acoustic wave filter.

14. A communication device comprising:
a duplexer of claim 13;
an antenna;
a mixer mixing a transmission signal with a carrier signal and outputting the antenna transmission signal; and
a power amplifier amplifying the antenna transmission signal and outputting the amplified antenna transmission signal to the antenna via the duplexer.

15. A communication device comprising:
a duplexer including the surface acoustic wave device of claim 1;
an antenna outputting an antenna reception signal to the duplexer;
an amplifier amplifying the antenna reception signal received from the duplexer; and
a mixer separating the reception signal from a carrier signal of the amplified antenna reception signal received from the amplifier.

* * * * *